United States Patent
Ou

(10) Patent No.: US 8,249,839 B2
(45) Date of Patent: Aug. 21, 2012

(54) METHOD FOR BUILDING MAGNETIC BEAD MATHEMATICAL MODEL

(75) Inventor: Guang-Feng Ou, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 196 days.

(21) Appl. No.: 12/752,164

(22) Filed: Apr. 1, 2010

(65) Prior Publication Data

US 2011/0178781 A1 Jul. 21, 2011

(30) Foreign Application Priority Data

Jan. 19, 2010 (CN) .......................... 2010 1 0300415

(51) Int. Cl.
*G06F 17/50* (2006.01)
*G06F 7/60* (2006.01)
*G06F 9/44* (2006.01)

(52) U.S. Cl. .................... 703/2; 703/1; 703/13; 703/14; 703/15; 703/16; 703/17; 703/18; 703/19; 703/20; 703/21; 703/22; 716/155

(58) Field of Classification Search .................. 703/1, 2, 703/13–22; 716/155
See application file for complete search history.

(56) References Cited

U.S. PATENT DOCUMENTS

| 7,657,564 B2* | 2/2010 | Hsu et al. .................... 333/186 |
| 2001/0048298 A1* | 12/2001 | Doshita et al. ............. 324/76.21 |
| 2006/0161413 A1* | 7/2006 | Wei et al. ........................ 703/14 |
| 2009/0267596 A1* | 10/2009 | Wang et al. .................. 324/228 |

OTHER PUBLICATIONS

Altera ("AN 583: Designing Power Isolation Filters with Ferrite Beads for Altera FPGAs"), 2009.*
Dale, Vishay. "Circuit Simulation of Surface Mount Inductors and Impedance Beads", 2006.*
Brown, Jim. "Understanding How Ferrites Can Prevent and Eliminate RF Interference to Audio Systems", 2005.*
Hageman, Steve. "Using ferrite bead models to analyze EMI suppression", 2000.*
Kim, et al. "3 GHz Wide Frequency Model of Surface Mount Technology (SMT) Ferrite Bead for Power/Ground and I/O Line Noise Simulation of High-speed PCB", 2003.*
"Understanding Ferrite Bead Inductors", 1998.*
Kimmel, William. "Wide Frequency Impedance Modeling of EM1 Ferrites", IEEE 1994.*
Weir, Steve. "Understanding Ferrite Beads and Applications", 2009.*
Hulkkonen, et al. "Measurement-Based Equivalent Circuit Model for Ferrite Beads", IEEE 2009.*

* cited by examiner

*Primary Examiner* — Hugh Jones
*Assistant Examiner* — Shambhavi Patel
(74) *Attorney, Agent, or Firm* — Altis Law Group, Inc.

(57) ABSTRACT

A method for building a magnetic bead mathematical model includes defining component elements of the model of the magnetic bead, building the model of the magnetic bead, obtaining a characteristic curve of an impedance of a magnetic bead in a standard magnetic bead specification of the magnetic bead, ascertaining parameters of the component elements, simulating the model of the magnetic bead, and comparing the characteristic curve with the characteristic curve in the standard magnetic bead specification, to further optimize the mode of the magnetic bead.

1 Claim, 4 Drawing Sheets

METHOD FOR BUILDING MAGNETIC BEAD MATHEMATICAL MODEL

BACKGROUND

1. Technical Field

The present disclosure relates to a method for building a magnetic bead mathematical model.

2. Description of Related Art

When mathematically modeling and simulating circuit board designs, an inductor and a resistor connected in series are used to simulate magnetic beads in low frequency applications because their characteristics are well known. However, it is well-known that impedance of a standard inductor increases with increase in frequency, while impedance of a magnetic bead decreases with increase in frequency. Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
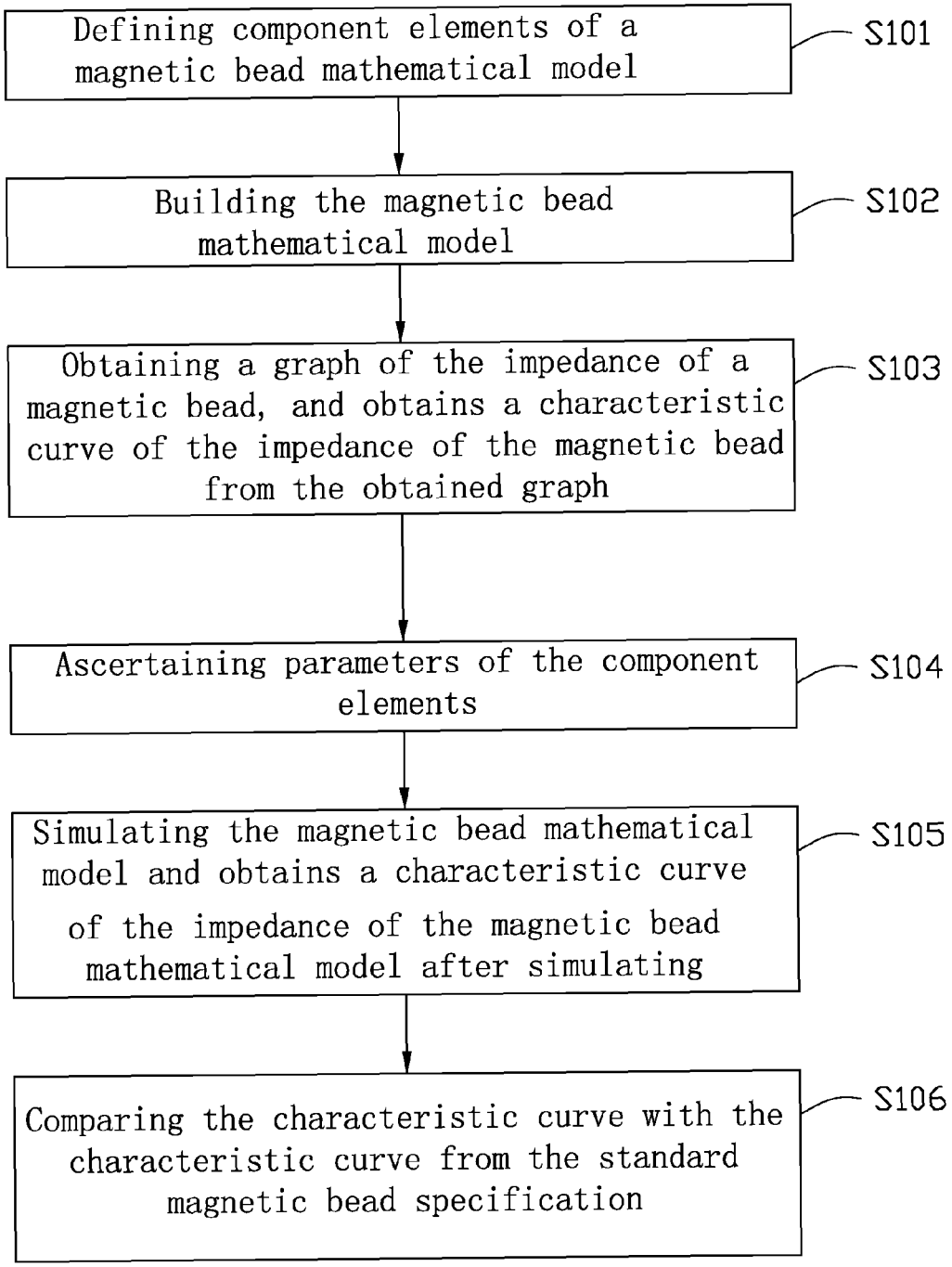
FIG. 1 is a flowchart of an embodiment of a method for building a mathematical model of a magnetic bead.
Figure 2:
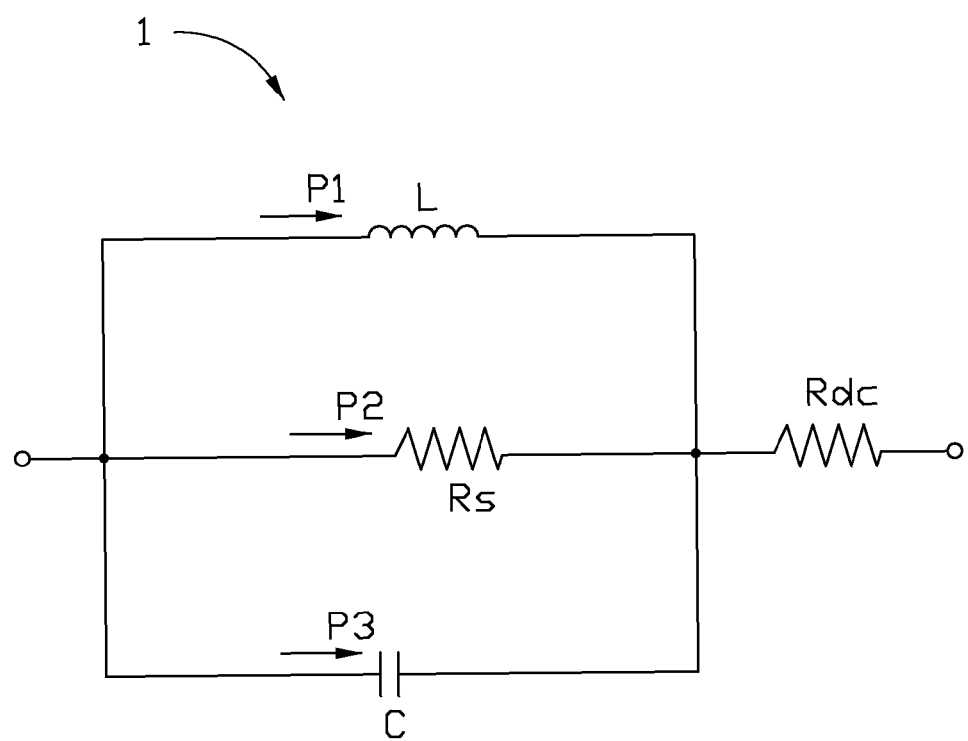
FIG. 2 is a schematic circuit diagram of the mathematical model obtained by using the mathematical method of FIG. 1.
Figure 3:
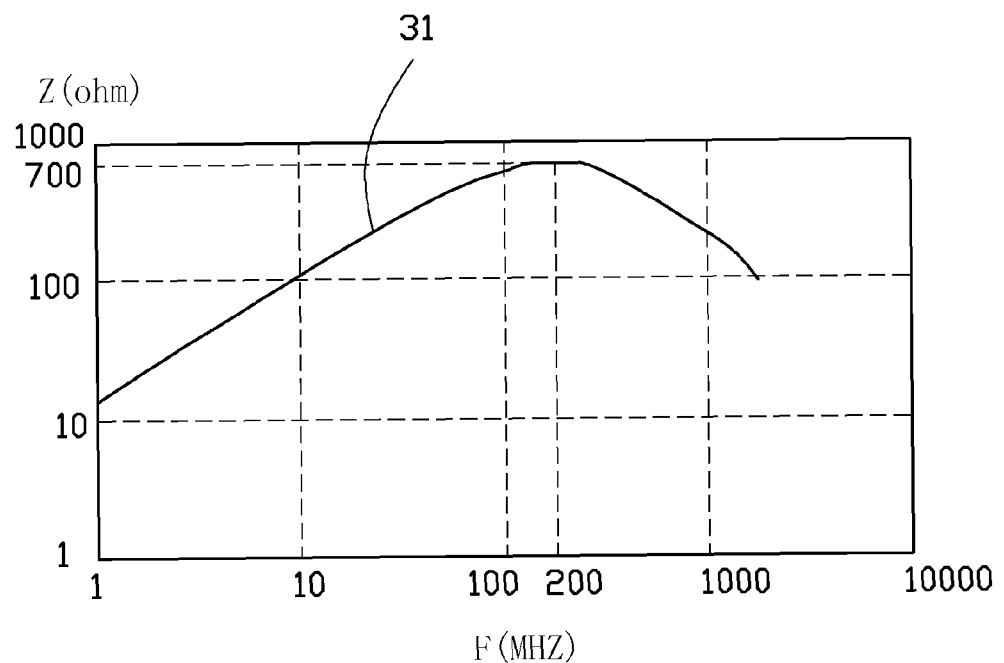
FIG. 3 is a graph of the impedance of a magnetic bead from a standard magnetic bead specification.

Referring to FIGS. 1 and 2, an exemplary embodiment of a method for building a magnetic bead mathematical model includes the following steps.

In step S101, a user defines component elements of a magnetic bead mathematical model 1 according to characteristic and function of the magnetic bead. The mathematical model 1 includes an inductor L and a capacitor C. Owing to the inductor L generates thermal losses during transmitting a signal, the mathematical model 1 also includes a thermal loss resistor Rs. Owing to every element generates thermal losses during direct current (DC) transmission, the mathematical model 1 further includes a resistor Rdc.

In step S102, the user builds the magnetic bead mathematical model 1 (see FIG. 2) according to the defined component elements of the mathematical model 1. In the mathematical model 1, the thermal loss resistor Rs is connected in series to the resistor Rdc. The inductor L is connected in parallel to the thermal loss resistor Rs. The capacitor C is connected in parallel to the thermal loss resistor Rs. A first to third current paths P1 to P3 are formed in the model 1. When the mathematical model 1 is used in a simulated low frequency application, currents flow along the first and second current path P1 and P2. When the mathematical model 1 is used in a high frequency application, currents flow along the third path P3. In other embodiments, the mathematical model 1 may show additional elements. For example, two or more inductors connected in series may replace the inductor L, and two or more resistors connected in series may replace the thermal loss resistor Rs, in this embodiment, each inductor is connected to a corresponding one thermal loss resistor Rs in parallel.

In step S103, the user obtains a graph of the impedance of a magnetic bead from a standard magnetic bead specification of the magnetic bead (a type of the magnetic bead is SBK160808T-601Y-S in one embodiment), and obtains a characteristic curve 31 of the impedance of the magnetic bead versus change in frequency, according to the frequency range the mathematical model 1 is being designed to work at, from the obtained graph.

In step S104, the user ascertains parameters of the inductor L, the capacitor C, the thermal loss resistor Rs, and the resistor Rdc according to the obtained characteristic curve 31.

The user ascertains the parameter of the resistor Rdc. Owing to a standard magnetic bead specification of the magnetic bead records the parameters of the resistor Rdc, the parameters of resistor Rdc is directly ascertained via referring to the standard magnetic bead specification, in the embodiment, Rdc=0.5 ohms.

The user ascertains the parameter of the inductor L. A frequency which is less than a resonance frequency, that is, less than the maximum impedance is selected from the characteristic curve 31, such as the frequency F=9 megahertz (MHz), a impedance Z corresponding to the frequency F=9 MHz is obtained from the characteristic curve 31, which is Z=100 ohms. According to a formula $Z=2\pi FL$, F=9 MHz, and Z=100 ohm, the parameters L of the inductor L can be obtained, L=107684 millihenries (MH).

The user ascertains the parameter of the thermal loss resistor Rs. Any frequency can be selected from the characteristic curve 31, such as F1=200 MHz. A resistance Zm corresponding to the frequency F1=200 MHz is obtained from the characteristic curve 31, which is Zm=700 ohm. According to the characteristic of a parallel resonance occurring between the inductor L and the capacitor C, a resistance of the model 1 of the magnetic bead is equal to a resistance of the thermal loss resistor Rs adding to a resistance of the resistor Rdc, which is Zm=Rs+Rdc. The thermal loss resistance Rs can be ascertained, which is Rs=Zm−Rdc=699.5 ohm.

The user ascertains the parameter of capacitor C. According to the resonance frequency formula $F1=1/2\pi\sqrt{LC}$, the resonance frequency F1=200 MHz, and the induction L=107681 MH, the parameter of capacitor C can be ascertained, which is C=0.35811 picofarad (PF).

Figure 4:
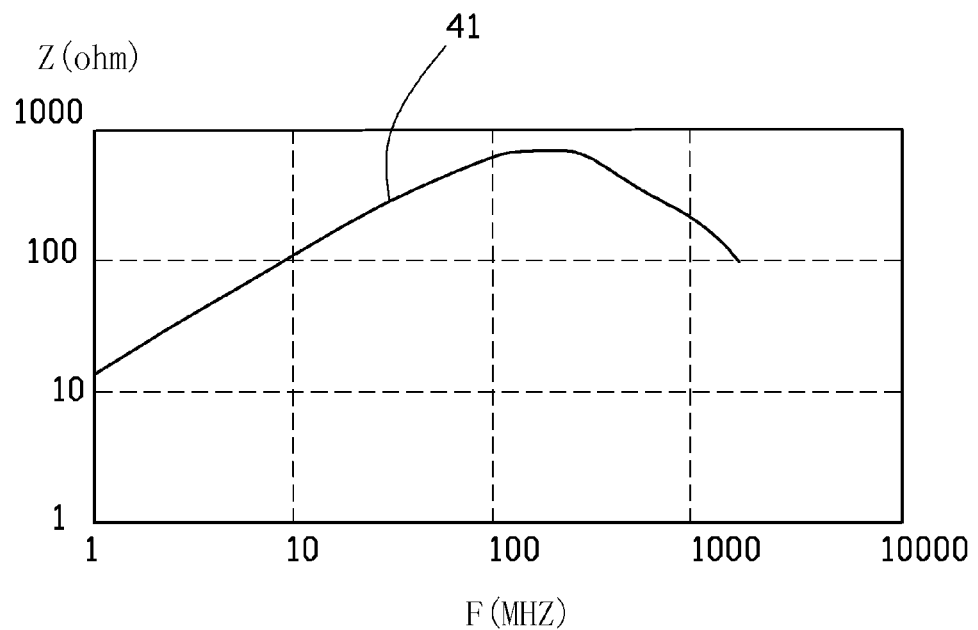
FIG. 4 is a graph of the impedance of the mathematical model of FIG. 2.

In step S105, the user simulates the mathematical model 1 of the magnetic bead and obtains a characteristic curve 41 of the impedance of the magnetic bead model after simulating, shown in FIG. 4.

In step S106, the user compares the characteristic curve 41 with the characteristic curve 31 from the standard magnetic bead specification, to further optimize the mathematical model 1 of the magnetic bead.

In other embodiments, any frequency less than the resonance frequency can be selected to ascertain the parameters of the capacitor C and the inductor L. In other embodiments, a characteristic curve of other types of the magnetic bead can be obtained to ascertain the parameters of the inductor L, the capacitor C, the thermal loss resistor Rs, and the resistor Rdc.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A method for building a magnetic bead mathematical model, the method comprising:

defining component elements of the magnetic bead mathematical model according to characteristic and function of the magnetic bead;

building the mathematical model of the magnetic bead according to the defined component elements of the mathematical model, wherein the model of the magnetic bead comprises an inductor, a capacitor, a first resistor, and a second resistor, the first resistor is connected in series to the second resistor, the inductor is connected in parallel to the first resistor, and the capacitor is connected in parallel to the first resistor;

obtaining a first characteristic curve of an impedance of a magnetic bead from a standard magnetic bead specification of the magnetic bead, wherein the first characteristic curve denotes the impedance of the magnetic bead changing with the frequency that the model works at;

ascertaining a parameter of the second resistor via referring to the standard magnetic bead specification of the magnetic bead;

selecting a first frequency which is less than a resonance frequency, that is, less than a maximum impedance in the first characteristic curve, obtaining a first resistance corresponding to the selected first frequency from the first characteristic curve, and ascertaining a parameter of the inductor according to a formula $Z=2\pi FL$, the selected first frequency, and the obtained first resistance, where, Z is a resistance, F is a frequency, and L is an induction;

selecting a second frequency in the first characteristic curve, obtaining a second resistance corresponding to the second frequency from the first characteristic curve, and ascertaining a parameter of the first resistor according to the characteristic of a parallel resonance occurring between the inductor and the capacitor, and a resistance of the magnetic bead mathematical model is equal to a resistance of the first resistor adding to a resistance of the second resistor; and ascertaining a parameter of the capacitor according to the resonance frequency formula $F1=\frac{1}{2}\pi\sqrt{LC}$, the resonance frequency, and the induction, wherein F1 is a resonance frequency, L is an induction, and C is a capacitance;

simulating the model of the magnetic bead according to the ascertained parameters of the component elements to form a second characteristic curve; and comparing the second characteristic curve with the first characteristic curve from the standard magnetic bead specification, to further optimize the magnetic bead mathematical model.

* * * * *